United States Patent
Kobayashi et al.

(10) Patent No.: US 6,344,742 B1
(45) Date of Patent: Feb. 5, 2002

(54) MAGNETIC FIELD SENSOR HAVING A FLUX GUIDE TO INCREASE THE EFFECTIVE CAPTURE AREA

(75) Inventors: Takeshi Kobayashi, Osaka; Hirokazu Kugai; Hideo Itozaki, both of Itami, all of (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/187,481

(22) Filed: Nov. 6, 1998

(30) Foreign Application Priority Data

Nov. 7, 1997 (JP) ................................. 9-322432
Jun. 11, 1998 (JP) ............................. 10-163788
Sep. 11, 1998 (JP) ............................. 10-258350

(51) Int. Cl.[7] ................................. G01R 33/02
(52) U.S. Cl. ................................. 324/248; 505/846
(58) Field of Search .................. 324/248; 505/171, 505/845, 846

(56) References Cited

U.S. PATENT DOCUMENTS

| 4,971,947 A | | 11/1990 | Barnes et al. | 505/171 |
| 4,996,621 A | * | 2/1991 | Ruigrok et al. | 324/248 |
| 5,463,518 A | | 10/1995 | Otomo et al. | 505/171 |
| 5,483,161 A | * | 1/1996 | Deeter et al. | 324/244.1 |
| 5,901,453 A | * | 5/1999 | Zhang et al. | 324/248 |

FOREIGN PATENT DOCUMENTS

| EP | 0 315 258 | | 5/1998 |
| WO | 90/00742 | * | 1/1990 |

OTHER PUBLICATIONS

Musikowski et al., "Welding unit for hollow section bolts—with magnetic flux shaping to produce field componensts radial to the bolt", Derwent Information ltd., Acct. No. 1995–124084, pp. 1–2.*

Oh, B., et al., "Multilevel YBaCuO Flux Transformers With High $T_c$ SQUIDs: A Prototype High $T_c$ SQUID Magnetometer Working at 77 K," Applied Physics Letters, 59(1), pp. 123–125 (Jul. 1991).

Tanaka, S., et al., "Properties of $YBa_2Cu_3O_{7-y}$ Large Washer SQUID," Japanese Journal of Applied Physics, vol. 32, pp. L662–L664 (May 1993).

* cited by examiner

*Primary Examiner*—Jay Patidar
(74) *Attorney, Agent, or Firm*—Foley & Lardner

(57) ABSTRACT

A magnetic field sensor has a SQUID, which is made of thin film of oxide superconductor deposited on a substrate, and a magnetic flux guide that has a higher permeability than vacuum to increase the effective capture area. The flux guide is positioned and aligned over a hole that is surrounded with superconducting current loop formed in a washer thereof. The SQUID also has a pair of Josephson junction formed on the washer and a pair of opposite terminals for connecting the washer to an outer circuit. In the SQUID, a variation in magnetic flux passing through the hole is detected in a form of variation in output voltage.

14 Claims, 8 Drawing Sheets

MAGNETIC FLUX

10mm

10mm

35

21 (22)

35

10

33

MAGNETIC FIELD SENSOR HAVING A FLUX GUIDE TO INCREASE THE EFFECTIVE CAPTURE AREA

BACKGROUND OF THE INVENTION

1. Field of the Invention

The present invention relates to a magnetometer or a device for detecting or measuring a weak magnetic field (hereinafter, a magnetic field sensor) improved in the effective capture area, in particular a magnetic field sensor having SQUID made of oxide superconductor.

2. Description of the Related Art

SQUID (Superconducting Quantum Interference Device) is a high sensitive magnetic field sensor consisting of a superconducting loop having one or two Josephson junctions. A typical SQUID pattern formed in a thin film of oxide superconductor deposited on a substrate consists of a washer which forms a superconducting current loop surrounding a hole, a pair of Josephson junctions formed in the washer, and a pair of opposite terminals for connecting the washer to an outer circuit. In the SQUID, a variation in magnetic flux of a magnetic field passing through the hole is detected or measured as a variation in output voltage.

In order to enhance the sensitivity or resolution of SQUID type magnetic field sensor, it is necessary to increase the effective capture area ($A_{eff}$) of the SQUID through which the magnetic flux passes.

Applied Physics Letters 59(1), July 1991, p123 discloses a SQUID coupled with a flux transformer to increase the sensitivity. This known magnetic flux sensor requires additional manufacturing step to prepare multi-turns of a pickup coil for the flux transformer in a thin film of oxide superconductor, so that the productivity is not high. Another demerit of this sensor resides in that flux transformer made of superconductor must be cooled down to a temperature lower than the critical temperature when it is used.

Japanese Journal of Applied Physics. Vol. 32 (1993), page L662 proposes to use a flux capture plate plate made of superconductor. Use of the flux capture plate plate is, however, limited due to such a fact that it is difficult to prepare in practice a large area thin film of oxide superconductor and hence its size is limited.

An object of the present invention is to solve the problems of known magnetic field sensors and to provide a magnetic field sensor having a simple structure but increased in the effective capture area.

SUMMARY OF THE INVENTION

The present invention provides a magnetic field sensor having a SQUID, characterized in that a flux guide made of a material that has a higher permeability than vacuum is arranged in such a manner that a flux passing through said flux guide is coupled with said SQUID.

The flux guide has preferably a height that is three times longer than a diameter of an end surface which is faced closely to the SQUID and has preferably a form of a truncated corn or polygon. The magnetic field guide can be a hollow body or has a through-hole passing from one end surface to another end surface.

The term "couple" includes two cases that the flux guide is coupled directly or indirectly with the SQUID.

In the direct coupling, the flux guide is placed preferably in coaxial with a hole and over a washer of the SQUID. In the indirectly coupling, the flux guide is placed on a pickup coil which is connected to the SQUID, so that the magnetic flux is guided to the pickup coil by the flux guide. Or, the flux guide is placed on a flux transformer which is connected to an input coil with which the SQUID is coupled, so that the magnetic flux is guided to the flux transformer by the flux guide and is sensed by the SQUID through the input coil.

The flux guide has preferably a pair of end surfaces each having a different surface area and a tapered side surface connecting the end surfaces, and one of the end surfaces is arranged in such a manner that the flux is guided to the SQUID and to the pickup coil by the flux guide. A ratio of diameter of an end surface which is opposite to an end surface which is faced closely to the SQUID to the latter end surface is more than 3 times but is less than 15 times.

The magnetic flux guide can be made of Permalloy.

The SQUID, coils, flux transformer and flux capture plate can be made of thin film(s) of oxide superconductor.

An additional flux capture plate can be arranged between the SQUID and the flux guide.

The magnetic field sensor can have a shield plate made of a material having a higher permeability than vacuum. The shield plate is arranged around the flux guide and in parallel with the SQUID.

An essence of the magnetic field sensor according to the present invention resides in that the flux guide made of a material having a higher permeability than vacuum is combined with SQUID directly or indirectly.

The magnetic flux guide used in the magnetic field sensor according to the present invention can be produced very easily because the flux guide has a simple shape, but has improved sensitivity due to its magnetic property or high permeability. Still more, since the flux guide is not made of superconductor, there is no special limitation in its dimensions and any flux guide having desired properties can be obtained.

The magnetic flux guide of the magnetic field sensor according to the present invention has preferably such a height that is three times longer more than a diameter of an end surface which is faced closely to the SQUID, when a shape of the magnetic flux guide is considered as a cylinder.

The magnetic flux guide has preferably such a shape that a ratio of diameter of a larger end surface to a smaller end surface that is faced closely to the SQUID is more than 3 times. By this arrangement, the magnetic flux can be captured much effectively comparing to a SQUID having the same effective capture area. The advantage of enlargement in effective capture area can not be expected when the ratio becomes more than 15 times. Therefore, the ratio is limited preferably within a range between 3 times and 15 times.

The flux guide is preferably made of Permalloy that is a material having high permeability and available on market. "Material having high permeability" means material whose permeability is higher than that of vacuum.

DESCRIPTION OF THE PREFERRED EMBODIMENTS

Now, several embodiments of magnetic field sensor according to the present invention will be described with referring to attached drawings. The scope of the invention, however, is not limited by these embodiments.

BRIEF DESCRIPTION OF THE DRAWINGS

FIG. 1A is a plan view and FIG. 1B is a side view.

FIG. 3A is a plan view and FIG. 3B is a side view.

FIG. 5A is a perspective view of a truncated cone configuration, FIG. 5B is a perspective view of a truncated trapezoid configuration, and FIG. 5C is a side view of FIGS. 5A and 5B, illustrating how the magnetic flux guide is positioned.

FIG. 7A is a side view and FIG. 7B is an end view.

FIG. 10A is a perspective view and FIG. 10B is a cross-sectional view.

FIG. 12A is a perspective view and FIG. 12B is a cross-sectional view.

DETAILED DESCRIPTION

Figure 9:
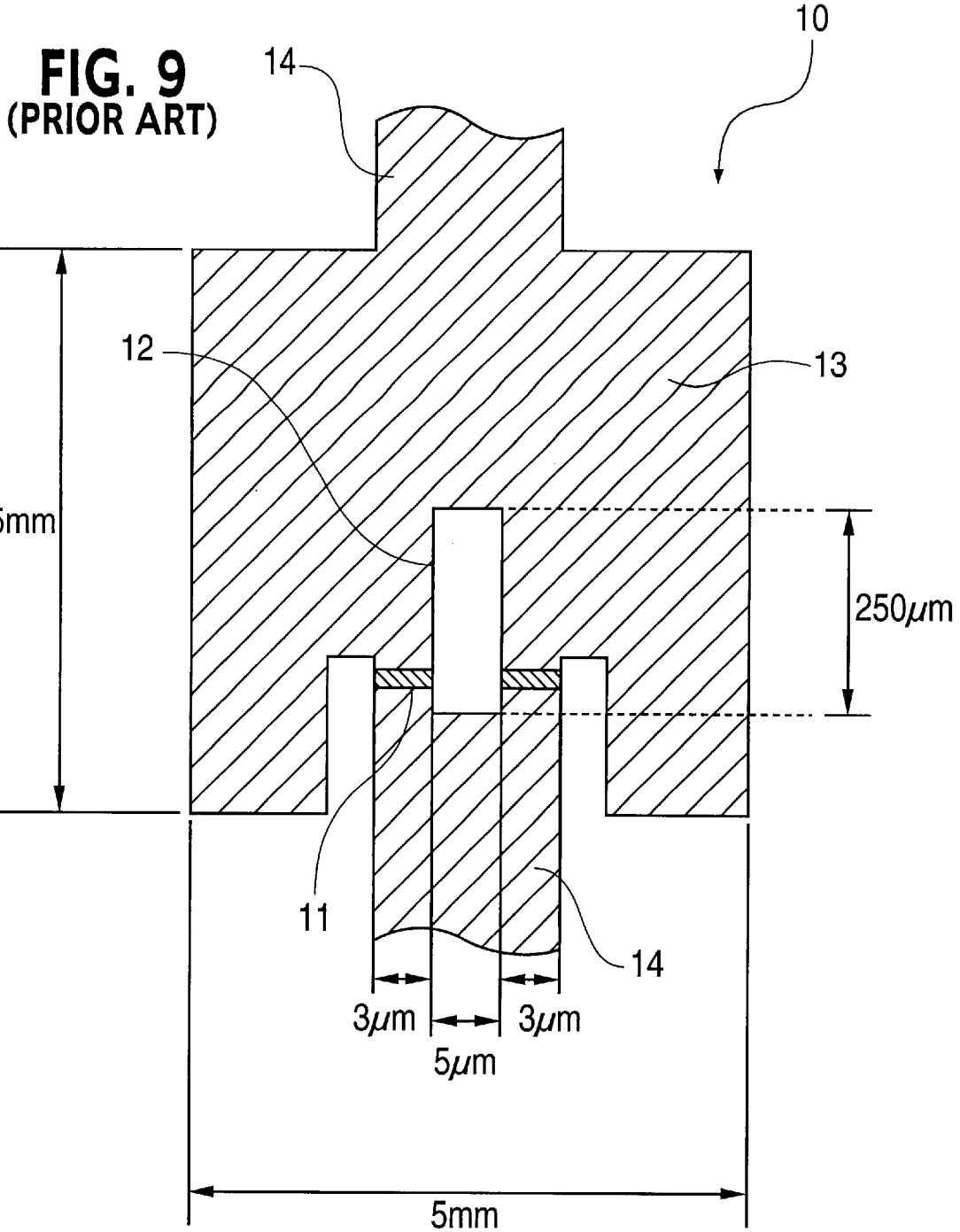
FIG. 9 is a plan view of a prior art SQUID made of oxide superconductor.

Firstly, a structure of the conventional SQUID (Superconducting Quantum Interference Device) is recalled with reference to FIG. 9 which shows a typical SQUID made of a t film of oxide superconductor. This SQUID is prepared in a thin film of oxide superconductor deposited on a substrate. A pattern of SQUID consists of a washer 13 that forms a superconducting current loop surrounding a hole 12, a pair of Josephson junctions 11 formed on the washer 13, and a pair of opposite terminals 14 for connecting the washer 13 to an outer circuit. In the SQUID, a variation in magnetic flux passing through the hole 12 is detectable in a form of variation in output voltage.

Figure 1A:
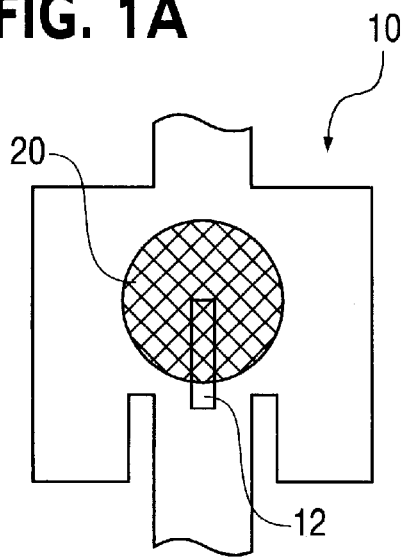
FIGS. 1A and 1B illustrate a magnetic field sensor according to the present invention.
Figure 1B:
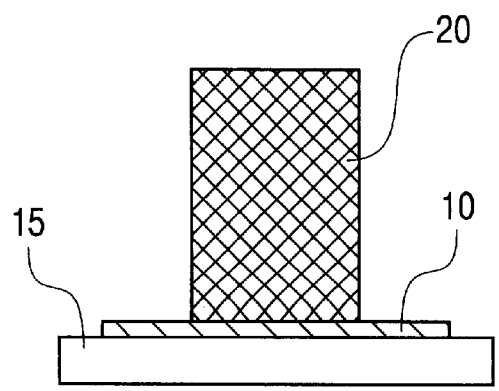

FIGS. 1A and 1B illustrate showing the principle of a Magnetic field sensor according to the present invention. As is shown in FIGS. 1A and 1B, a magnetic field sensor according to the present invention consists mainly of a SQUID 10 formed on a substrate 15 and a flux guide 20 positioned on the SQUID 10. The SQUID 10 itself is same as the conventional SQUID of FIG. 9. The flux guide 20 is placed on a hole pattern 12 in such a manner that the SQUID 10 is positioned coaxially with the washer 13.

Figure 2A:
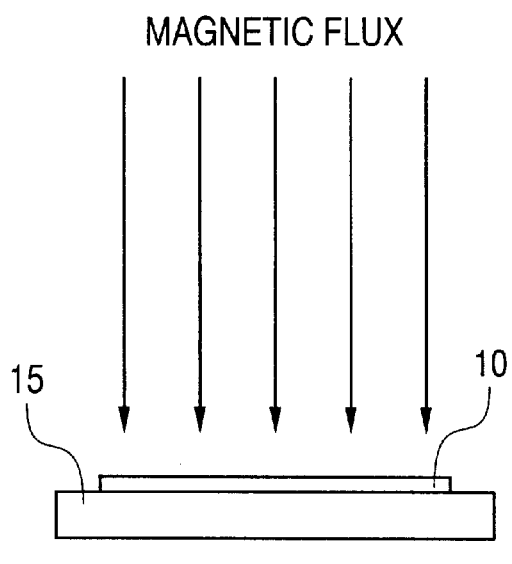
FIG. 2A schematically illustrates the flux field according to prior art.
Figure 2B:
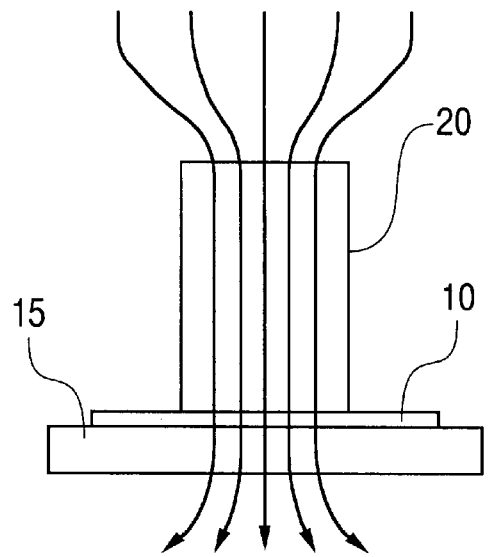
FIG. 2B schematically illustrates the flux field when a magnetic flux guide is used according to the present invention.

FIGS. 2A and 2B is an illustrative view explaining the function of the magnetic field sensor shown in FIG. 1. FIG. 2A shows a case when only SQUID 10 that is formed on the substrate 15 detects the magnetic flux. In this case, the magnetic flux detected by the SQUID 10 is limited to those that pass inside the washer 13 of the SQUID 10. FIG. 2 (B) shows a case of the present invention in which the magnetic flux is attracted or absorbed by the flux guide 20 of high permeability so that SQUID 10 detects a larger area of the magnetic flux which is determined by a horizontal cross sectional area of the flux guide 20. In other words, a larger area of the magnetic flux which is wider than effective capture area ($A_{eff}$) of the SQUID 10 alone.

Figure 3A:
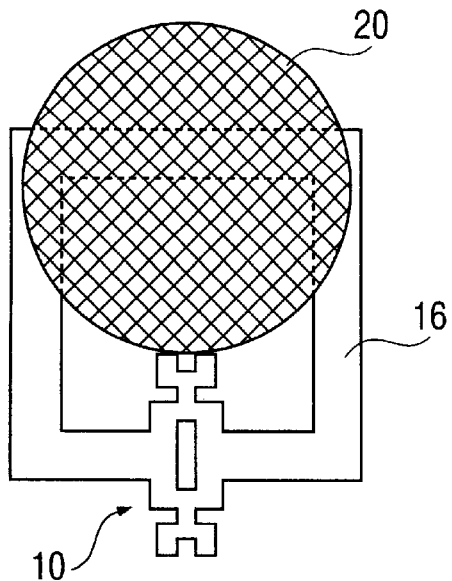
FIGS. 3A and 3B illustrate another embodiment of the present invention.
Figure 3B:
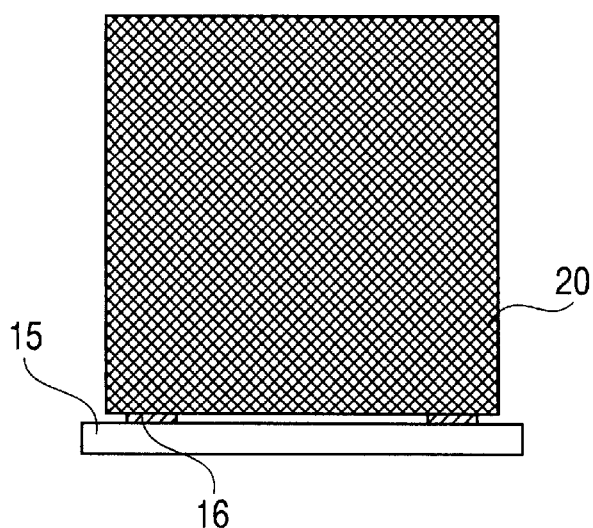

FIGS. 3A and 3B illustrate another embodiment of a magnetic field sensor according to the present invention. The magnetic field sensor has a pickup coil 16 connected to a SQUID 10 as is shown in FIG. 3A and a flux guide 20 according to the present invention is placed on the pickup coil 16.

Figure 4:
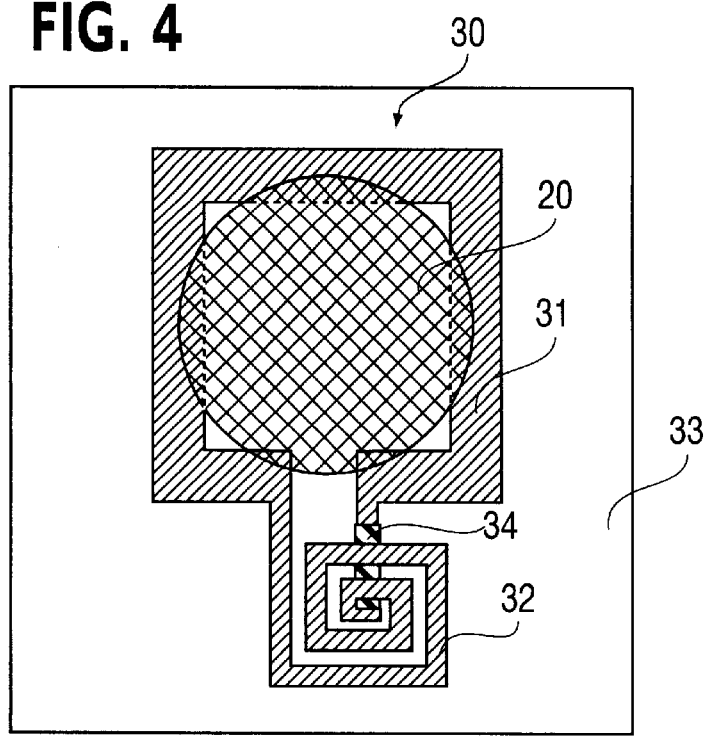
FIG. 4 illustrates another embodiment according to the present invention that incorporates a flux transformer.

FIG. 4 is an illustration showing a flux transformer that is used in another embodiment of a magnetic field sensor according to the present invention. The flux transformer 30 is a pattern formed in a thin film of oxide superconductor deposited on a substrate 33 as is shown in FIG. 4 and consists of a pickup coil 31 of a big rectangular and an input coil 32 having a plurality of windings. The windings of the input coil 32 are separated from crossunder by an insulator layer 34 inserted beneath the input coil 32. A flux guide 20 according to the present invention is positioned at the center of the pickup coil 31 of the flux transformer 30.

Figure 5A:
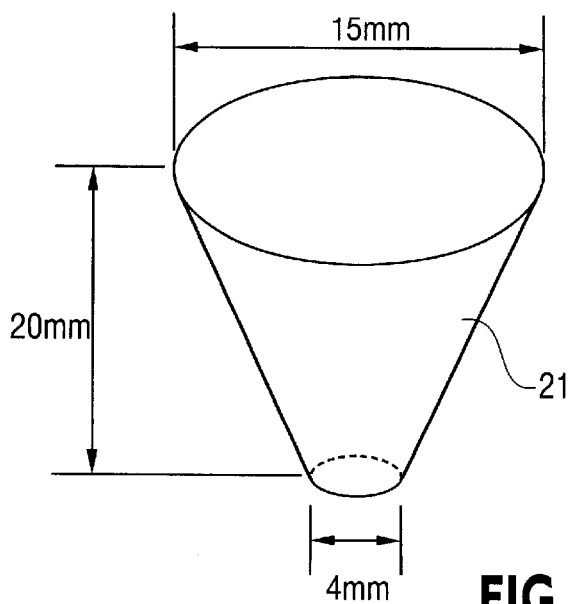
FIGS. 5A–5C illustrate various configurations of the magnetic flux guide according to the present invention.
Figure 5C:
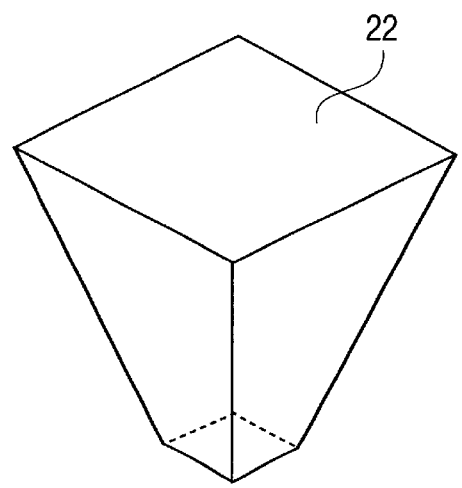
Figure 5B:
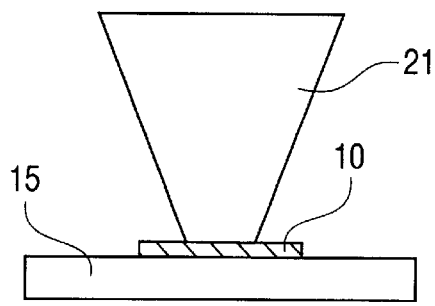

FIGS. 5A–5C illustrate variations of the flux guide usable in the magnetic field sensor according to the present invention. As is shown in FIG. 5A, the flux guide 21 has a smaller base end, a larger top end and a tapered side surface connecting the end surfaces.

Figure 6:
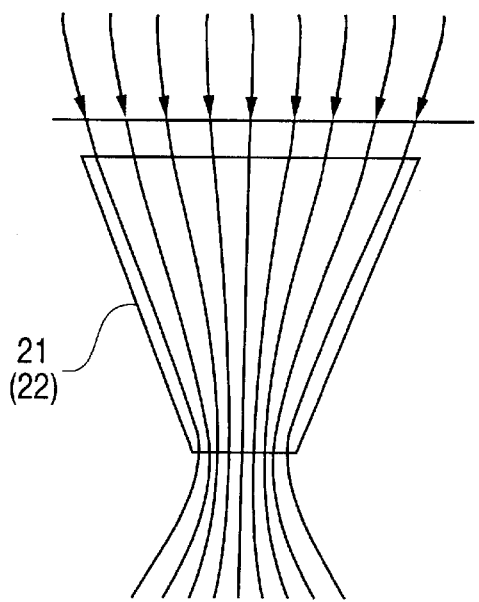
FIG. 6 schematically illustrates the function of the magnetic flux guide of FIGS. 5A–5C.

FIG. 6 is an illustration showing such a fact that the above-mentioned shape permits to converge the magnetic flux capture plated at the larger top end and to guide the resulting converged flux toward a SQUID so that the magnetic flux is introduced into the SQUID at high efficiency. Sensitivity of the magnetic field sensor can be adjusted by modifying the shape or configuration of the flux guide.

The flux guide has a horizontal cross section of a circle as is shown in FIG. 5A and can have a horizontal cross section of a rectangular as is shown in FIG. 5B so as to accord to a hole pattern of SQUID. Of course, any horizontal cross section can be used in accordance with necessity and advantage of the present invention does not depend on the shape of horizontal cross section.

Figure 7A:
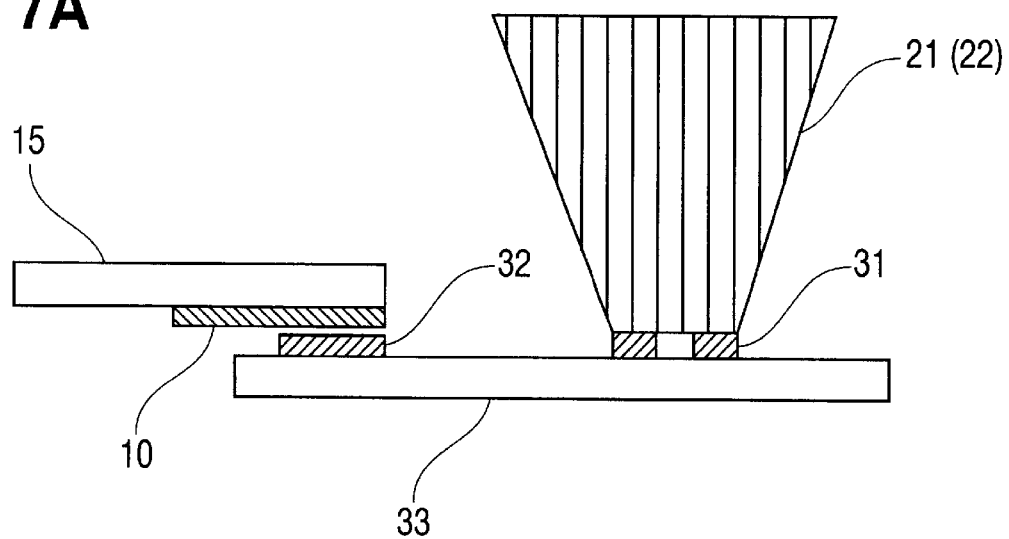
FIGS. 7A and 7B illustrate the magnetic field sensor of FIG. 4 with a SQUID.
Figure 7B:
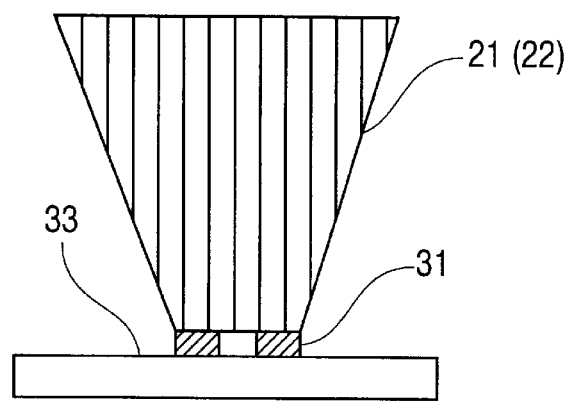

FIGS. 7A and 7B illustrate how to combine the magnetic flux transformer 30 shown in FIG. 4 with a SQUID. As is shown in FIGS. 7A and 7B, a substrate 15 having a SQUID 10 thereon is reversed up and down and is positioned in such a position that an input coil 32 of the magnetic flux transformer on which a magnetic flux guide 21 (22) is positioned is faced closely to the SQUID 10. This arrangement permit to transfer a magnetic flux capture plated by the flux guide 21(22) to the SQUID 10 at very high efficiency.

Figure 8A:
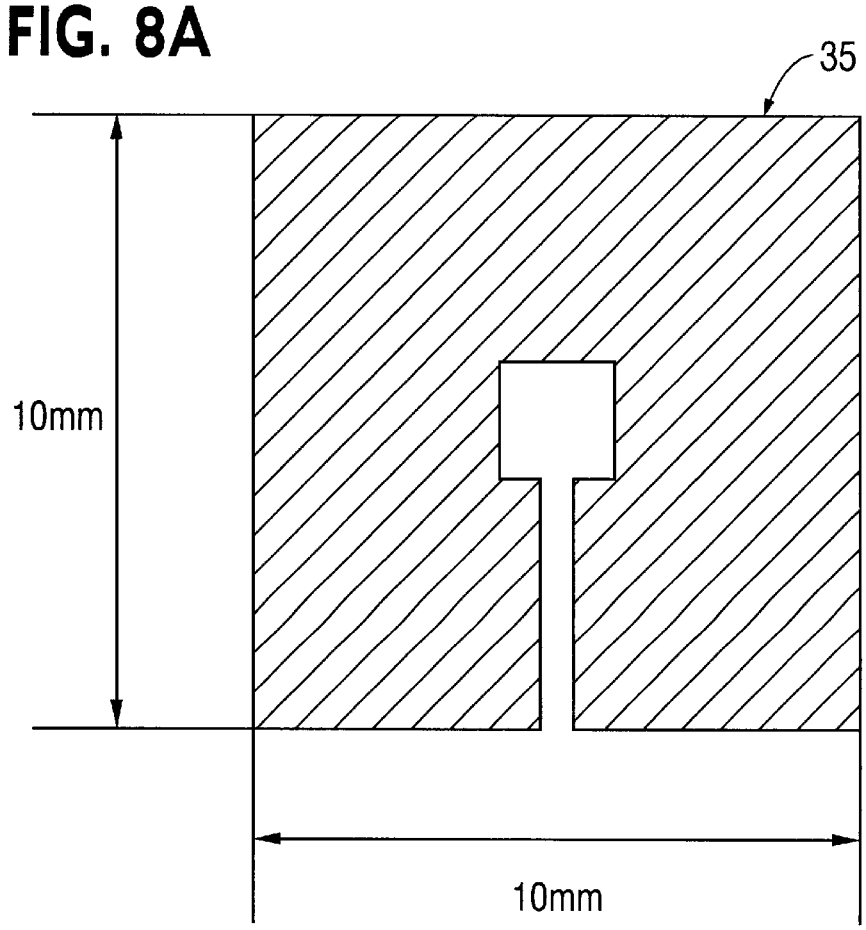
FIGS. 8A and 8B illustrate another magnetic field sensor according to the present invention, with a capture plate.
Figure 8B:
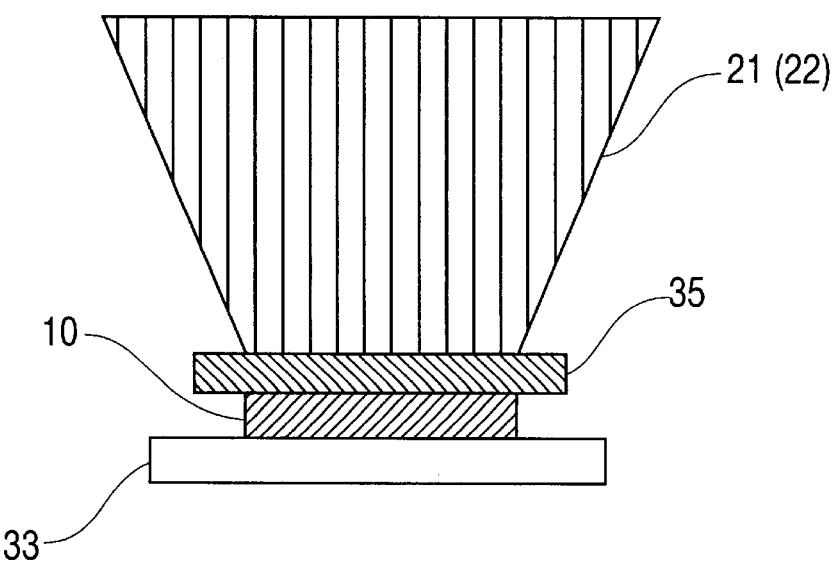

FIGS. 8A and 8B show another embodiment of the present invention in which a capture plate 35 is used. The capture plate 35 can be prepared by a thin film of oxide superconductor deposited on a substrate.

Figure 10A:
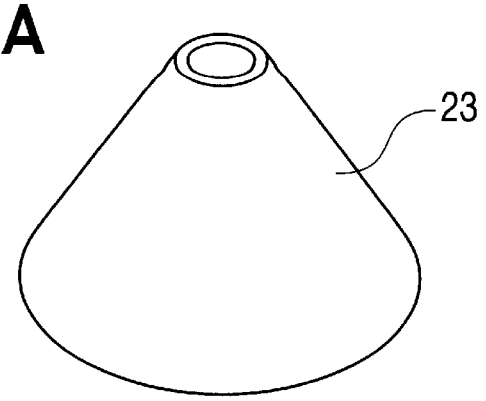
FIGS. 10A and 10B illustrate another embodiment of a magnetic flux guide.
Figure 10B:
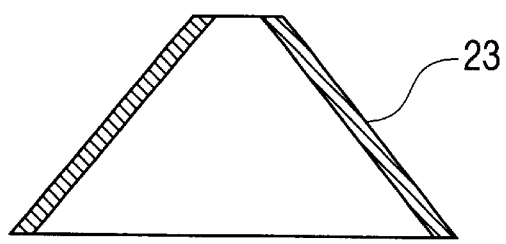

FIGS. 10A and 10B illustrate another structure of the magnetic flux guide that can be used in the magnetic field sensor according to the present invention. As is shown in FIG. 10A, the magnetic flux guide 23 used in this embodiment has the same side view of a truncated cone as shown is FIG. 5B but is a hollow body having an open top end and an open bottom end as is shown in a cross section of FIG. 10B.

Figure 11:
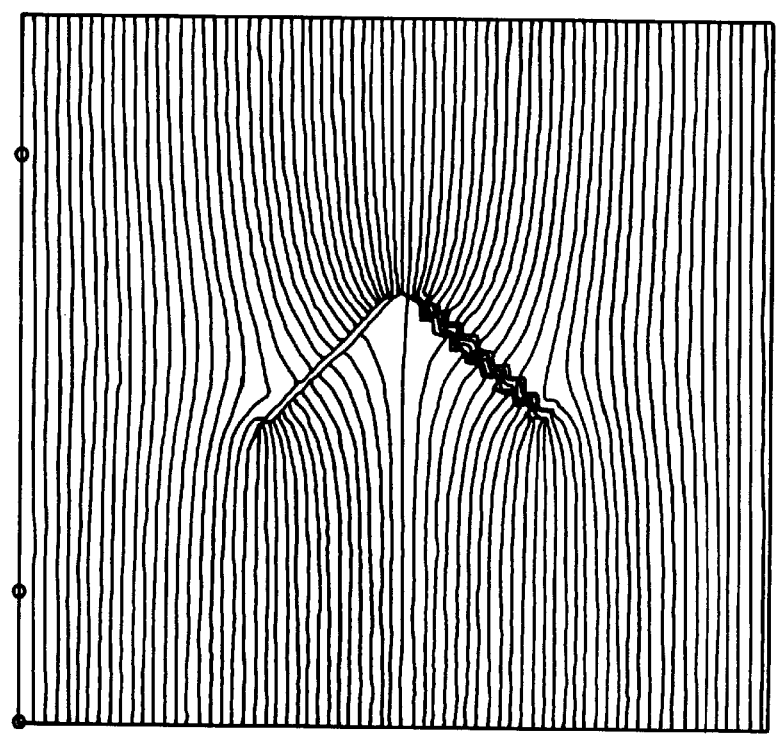
FIG. 11 illustrates how the magnetic flux guide of FIGS. 10A and 10B changes the flux field.

FIG. 11 is a mimetic diagram illustrating how the magnetic fluxes pass or distribute when the hollow magnetic flux guide 23 of FIGS. 10A and 10B is placed in a magnetic field. FIG. 11 reveals such a fact that the fluxes passing through the magnetic flux guide 23 is concentrated at a narrower end thereof and such displacement occurs along a surface of the flux guide 23 and that the flux guide functions to concentrate the magnetic flux. In other words, the effective capture area ($A_{eff}$) of SQUID can be increased by arranging the flux guide in such a manner that its narrower end surface faces closely to the SQUID.

The hollow flux guide can be manufactured by any known technique such as molding in which the flux guide is obtained in a piece, machining in which a bore is drilled in a solid body, or deformation of a sheet metal. Material of the hollow flux guide may be the same as those above-mentioned.

Figure 12A:
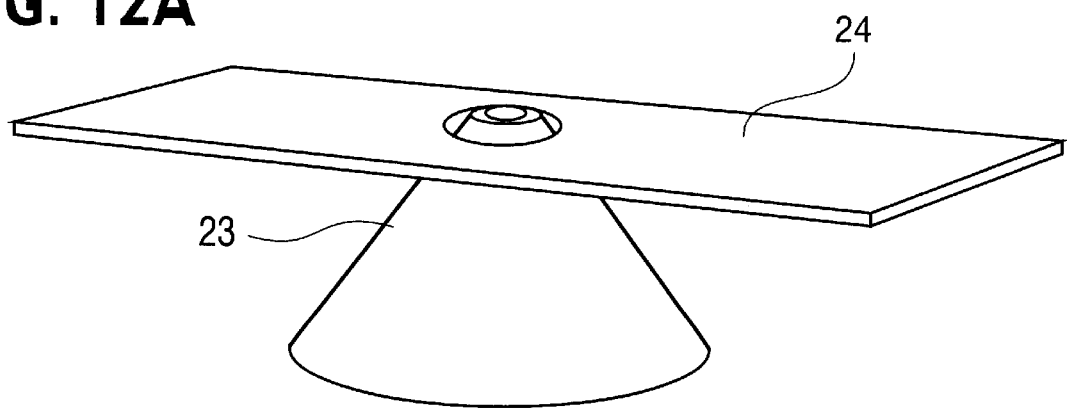
FIGS. 12A and 12B illustrates another embodiment of a magnetic flux guide, which is similar to the embodiment of FIGS. 10A and 10B, but with a shield plate.
Figure 12B:
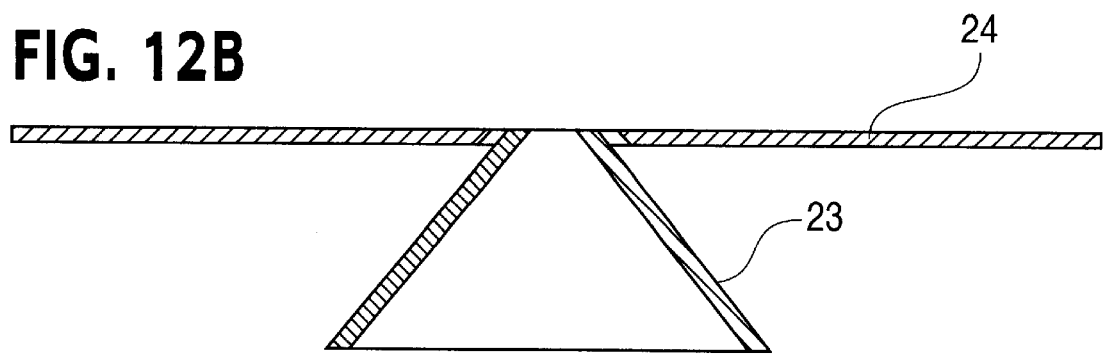

FIGS. 12A and 12B illustrate a magnetic flux guide assembly that can be made of basically same material as the magnetic flux guide shown in FIGS. 10A and 10B. The magnetic flux guide assembly shown in FIGS. 12A and 12B comprises the same flux guide 23 as shown in FIGS. 10A and 10B and a flat shield plate 24. The flat shield plate 24 has a center hole as is shown in FIG. 12B into which a top end of the flux guide 23 is inserted. The flat shield plate 24 can be made of a material having high permeability.

The magnetic flux guide assembly is placed on a SQUID in such a manner that the flux guide 23 is arranged at the same position as the flux guide shown in FIGS. 5A–5C. In this assembly, the function of flux guide 23 is same as shown in FIGS. 10A and 10B but an additional advantage is obtained by the flat shield plate 24.

Figure 13:
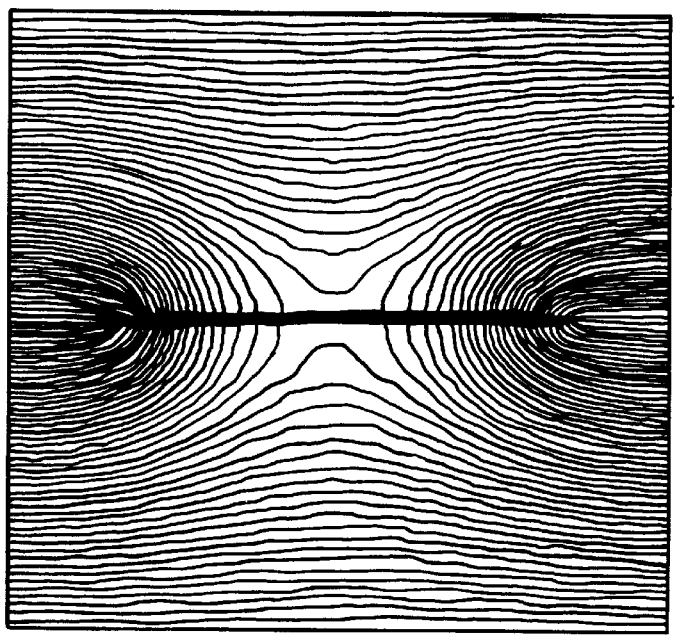
FIG. 13 illustrates the function of the flux guide of FIGS. 12A and 12B.

FIG. 13 is a mimetic diagram illustrating how the magnetic fluxes pass or distribute when the flat shield plate 24 is placed in a magnetic field. FIG. 13 reveals that the magnetic fluxes passing through the flat shield plate 24 is concentrated at opposite ends thereof and hence, when the flat shield plate 24 is used, surrounding magnetic fluxes that do not pass through the flux guide 23 can be separated from SQUID so that much precious detection of fluxes is assure. The flat shield plate 24 has another function to that the SQUID can be separated from magnetic fluxed which are in parallel with the SQUID.

Now, we will explain several examples of magnetic field sensors produced according to the present invention.

EXAMPLE 1

A thin film of $Ho_1Ba_2Cu_3O_{7-x}$ ($0 \leq x \leq 1$) having a thickness of 2,000 Å was deposited on a substrate made of $SrTiO_3$ on which a step having a height of 1,500 Å was made. The thin film was then etched to have a pattern and dimensions shown in FIG. 9 to produce a step-edge type SQUID having Josephson junctions. The Josephson junction has a width of 3 μm. The SQUID has an inductance of 80 pH.

The SQUID was immersed in liquid nitrogen to find the effective capture area ($A_{eff}$) of 0.2 mm$^2$.

Then, a cylindrical flux guide made of Permalloy and having a diameter of 2 mm and a height of 10 mm was placed on the SQUID and the effective capture area ($A_{eff}$) was measured. The effective capture area ($A_{eff}$) increased to 0.3 mm$^2$.

EXAMPLE 2

Example 1 was repeated but the magnetic flux guide made of Permalloy and having a shape and dimensions shown in FIG. 5A was placed on the SQUID.

The effective capture area ($A_{eff}$) increased to 0.6 mm$^2$.

EXAMPLE 3

A SQUID having a pickup coil shown in FIG. 3 was fabricated with the same material as Example 1. This SQUID has a hole having the same dimension as Example 1 and the pickup coil is rectangular each side being 5 mm. The same magnetic flux guide as Example 2 was placed on the SQUID equipped with the pickup coil and the effective capture area ($A_{eff}$) was determined.

The effective capture area ($A_{eff}$) increased from 0.2 mm$^2$ to 0.6 mm$^2$.

EXAMPLE 4

A magnetic capture plate for fluxes is added to a SQUID that was then combined with the magnetic flux guide to prepare a magnetic field sensor. Namely, the capture plate having a shape and dimensions shown in FIG. 8A was placed over the same SQUID as Example 1 and then a magnetic flux guide made of the same material and having a shape and dimensions shown in FIG. 5A was placed on the capture plate to produce a magnetic field sensor having a cross sectional view of FIG. 8B.

The effective capture area ($A_{eff}$) determined by the same method as other Examples increased from 0.3 mm$^2$ to 0.9 mm$^2$.

EXAMPLE 5

A magnetic flux transformer having an input coil consisting of ten (10) rectangular turns or windings and having a 10 mm square pickup coil was fabricated with the same material of SQUID in Example 1. An insulation layer 34 for the input coil was made of thin film of $SrTiO_3$. The magnetic flux transformer was combined with the same SQUID as Example 1 to fabricate a magnetic field sensor. The effective capture area ($A_{eff}$) of this sensor was 1.0 mm$^2$.

Then, a magnetic flux guide having the same shape as FIG. 5A but having a base diameter of 9 mm was placed on the magnetic flux transformer to fabricate another magnetic field sensor. The effective capture area ($A_{eff}$) of this sensor was 2.0 mm.

EXAMPLE 6

A member which functions by itself as a magnetic field sensor was prepared by using the same SQUID and magnetic flux transformer as Example 5 was fabricated. A magnetic flux guide having a reverse truncated conical shape having a base diameter of 9 mm which faces to the member, a top diameter of 27 mm and a height of 45 mm was placed on the member to fabricate a magnetic field sensor.

The effective capture area ($A_{eff}$) of this magnetic field sensor was 4.0 mm$^2$.

EXAMPLE 7

A member, which functions by itself as a magnetic field sensor, was prepared by using the same SQUID. A hollow magnetic flux guide having a reverse truncated conical shape having a base diameter of 10, a top diameter of 3 mm and a height of 10 mm was fabricated from a sheet having a thickness of 1 mm and was placed on the SQUID to prepare a magnetic field sensor.

The effective capture area ($A_{eff}$) of this magnetic field sensor was 0.6 mm$^2$.

EXAMPLE 8

The same SQUID and a magnetic flux guide as Example 7 were used.

A magnetic shield plate as is shown in FIGS. 12A and 12B was fabricated form a metal sheet having a thickness of 1 mm, a width of 30 mm and a length of 30 mm. The magnetic flux guide was placed on the SQUID and the magnetic shield plate was positioned in parallel with a surface of the, SQUID at a distance of 2 mm to prepare a magnetic field sensor.

The effective capture area ($A_{eff}$) of this magnetic field sensor was 0.6 mm². Magnetic noise was reduced one order comparing to Example 1 by using the magnetic shield plate.

In the examples, although $Ho_1Ba_2Cu_3O_{7-1}$ was used to prepare SQUID and other parts, the material is not limited to this but the same advantages can be obtained when the magnetic flux is combined with SQUID made of other oxide superconductors such as $Y_1Ba_2Cu_3O_7$-or metal type superconductors are used.

As is described above, the magnetic field sensor according to the present invention has a simple structure but permits to increase the effective capture area at high efficiency.

The magnetic flux guide used in the magnetic field sensor according to the present invention can be produced from not expensive material and easily so that manufacturing cost of the magnetic field sensor can be reduced. The magnetic field sensor according to the present invention can be handled easily. In summary, the present invention increases application of the magnetic field sensors.

What is claimed is:

1. A magnetic field sensor comprising:
   a SQUID having a washer with a hole, a superconducting current loop surrounding the hole, a pair of Josephson junction formed on the washer, and a pair of opposite terminals for connecting the washer to an outer circuit; and
   a flux guide that has a higher permeability than vacuum coupled with said SQUID to increase an effective capture area of flux passing through the hole,
   wherein said flux guide comprises a truncated cone with a through-hole extending from one end surface to an opposite end surface,
   wherein said flux guide further includes a shield plate made of a material having a higher permeability than vacuum, said shield plate being arranged around the opposite end surface of said truncated cone and parallel with said SQUID.

2. The magnetic field sensor set forth in claim 1, wherein said truncated cone is coupled directly with the SQUID.

3. The magnetic field sensor set forth in claim 2, wherein said truncated cone is positioned coaxially with said hole, over said washer of said SQUID.

4. The magnetic field sensor set forth in claim 1, wherein said truncated cone is coupled indirectly with the SQUID.

5. The magnetic field sensor set forth in claim 4, further including a magnetic flux transformer connected to said washer, wherein said truncated cone is placed on said magnetic flux transformer so that said truncated cone guides magnetic flux to said magnetic flux transformer.

6. The magnetic field sensor set forth in claim 5, wherein said magnetic flux transformer has a pickup coil and an input coil connected to said pickup coil, wherein said truncated cone is placed on said pickup coil so that said truncated cone guides magnetic flux to said pickup coil.

7. The magnetic field sensor set forth in claim 6, wherein the one end surface is arranged over said pickup coil to guide flux to said pickup coil.

8. The magnetic field sensor set forth in claim 7, wherein a ratio of diameter of the opposite end surface and the one end surface positioned next to said pickup coil is more than 3 times but is less than 15 times.

9. The magnetic field sensor set forth in claim 1, wherein said truncated cone is made of Permalloy.

10. The magnetic field sensor set forth in claim 1, wherein said SQUID, said pickup and input coils of said magnetic flux transformer, and flux capture plate are made of thin film of oxide superconductor.

11. A magnetic field sensor comprising:
    a SQUID having a washer with a hole, a superconducting current loop surrounding the hole, a pair of Josephson junction formed on the washer, and a pair of opposite terminals for connecting the washer to an outer circuit; and
    a flux guide that has a higher permeability than vacuum coupled with the SQUID to increase an effective capture area of flux passing through the hole,
    wherein the flux guide comprises a body having a through-hole passing from one end surface to an opposite end surface, and having a tapered side surface that connects the end surfaces,
    wherein the one and opposite end surfaces of the body have different surface areas and the one end surface is positioned facing the washer, and
    wherein the flux guide has a shield plate made of a material having a higher permeability than vacuum, the shield plate being arranged around the opposite end surface of the body and parallel with the SQUID.

12. The magnetic field sensor set forth in claim 11, further including a magnetic flux transformer connected to the washer, wherein the body is placed on the magnetic flux transformer so that the body guides the magnetic flux to the magnetic transformer.

13. The magnetic field sensor set forth in claim 12, wherein the magnetic flux transformer has a pickup coil and an input coil connected to said pickup coil, wherein the one end surface of the body is placed on said pickup coil so that the body guides magnetic flux to said pickup coil.

14. The magnetic field sensor set forth in claim 13, wherein the body has a truncated cone configuration, with a ratio of diameter of the other end surface and the one end surface positioned next to said pickup coil is more than 3 times but is less than 15 times.

* * * * *